(12) United States Patent
Uchiyama et al.

(10) Patent No.: US 7,541,865 B2
(45) Date of Patent: Jun. 2, 2009

(54) EER HIGH FREQUENCY AMPLIFIER

(75) Inventors: Kazuhiro Uchiyama, Shizuoka (JP); Shinji Ohkawa, Kanagawa (JP)

(73) Assignee: Panasonic Corporation, Osaka (JP)

( * ) Notice: Subject to any disclaimer, the term of this patent is extended or adjusted under 35 U.S.C. 154(b) by 0 days.

(21) Appl. No.: 11/575,546

(22) PCT Filed: Sep. 16, 2005

(86) PCT No.: PCT/JP2005/017174

§ 371 (c)(1),
(2), (4) Date: Mar. 19, 2007

(87) PCT Pub. No.: WO2006/033303

PCT Pub. Date: Mar. 30, 2006

(65) Prior Publication Data

US 2007/0247232 A1    Oct. 25, 2007

(30) Foreign Application Priority Data

Sep. 21, 2004    (JP) .............................. 2004-273890

(51) Int. Cl.
*H03F 3/38*    (2006.01)
(52) U.S. Cl. .................... 330/10; 330/126; 330/298; 455/127.1
(58) Field of Classification Search .............. 330/10, 330/126, 298; 455/127.1
See application file for complete search history.

(56) References Cited

U.S. PATENT DOCUMENTS 5,847,602 A    12/1998    Su (Continued)

FOREIGN PATENT DOCUMENTS

JP    08222973    8/1996

(Continued)

OTHER PUBLICATIONS

International Search Report dated Dec. 27, 2005.

(Continued)

*Primary Examiner*—Michael B Shingleton
(74) *Attorney, Agent, or Firm*—Dickinson Wright, PLLC (57) ABSTRACT

An EER high frequency amplifier wherein the dynamic range of the gain can be widened by performing a predetermined control of a device in a high frequency amplifying part and thereby enhancing the isolation within the device. In an EER high frequency amplifier (1), an envelope detecting part (2) extracts an amplitude signal from an input high frequency signal, while a limiter (3) extracts a phase signal therefrom. A baseband amplifying part (4) generates a voltage in accordance with the amplitude signal and supplies it as the drain voltage of a GaAs FET (5*a*) of a high frequency amplifying part (5). When the drain voltage is below a predetermined first reference voltage, a gate voltage control part (6) holds an initially established gate voltage. When the drain voltage exceeds the first reference voltage, the gate voltage control part (6) so controls the gate voltage as to be proportional to the drain voltage. Moreover, when the drain voltage is above a second reference voltage that is higher than the first reference voltage, the gate voltage control part (6) holds the initially established gate voltage. When the drain voltage is below the second reference voltage, the gate voltage control part (6) so controls the gate voltage as to be proportional to the drain voltage.

5 Claims, 6 Drawing Sheets

U.S. PATENT DOCUMENTS 6,681,101 B1 * 1/2004 Eidson et al. ............ 455/127.1
7,145,396 B2 * 12/2006 Dupuis ....................... 330/298

FOREIGN PATENT DOCUMENTS

JP         10256843        9/1998
JP         3207153         7/2001

OTHER PUBLICATIONS

Masaomi Suzuki, "New Low Frequency/High Frequency Circuit Design Manual," CQ Publishing, 2 pages total, 1998, with partial English translation.

* cited by examiner

EER HIGH FREQUENCY AMPLIFIER

TECHNICAL FIELD

The present invention relates to an EER high frequency amplifier that carries out amplification and amplitude modulation by receiving an amplitude signal and controlling a power supply voltage.

BACKGROUND ART

Conventionally, in wireless communication equipment or the like, an amplification scheme has been proposed that uses an EER (Envelope Elimination and Restoration) modulation amplifier having high-efficient modulation and amplification performance. This EER modulation amplifier amplifies a high frequency signal using a class B or class E saturated amplifier, and further carries out amplitude modulation by inputting the amplitude signal to a power supply terminal of an amplification section in the last of the saturated amplifier. Therefore, this EER modulation amplifier has a complex function where a modulation function is added to a linear amplification function of the original high frequency amplifier (for example, see Patent Document 1). In this type of the EER high frequency amplifier, a high frequency amplification section amplifies only the phase signal which does not include amplitude information, and, for example, the high frequency amplification section configured with gallium arsenide FET (GaAs FET) carries out amplitude modulation by controlling the drain supply voltage according to the amplitude signal based on the change in gain of GaAs FET according to the drain voltage. According to this configuration, the high frequency amplification section does not amplify the amplitude signal, so that it is possible to use a high-efficient saturated amplifier for the high frequency amplification section. As a result, it is possible to improve efficiency of the EER high frequency amplifier.

Figure 1:
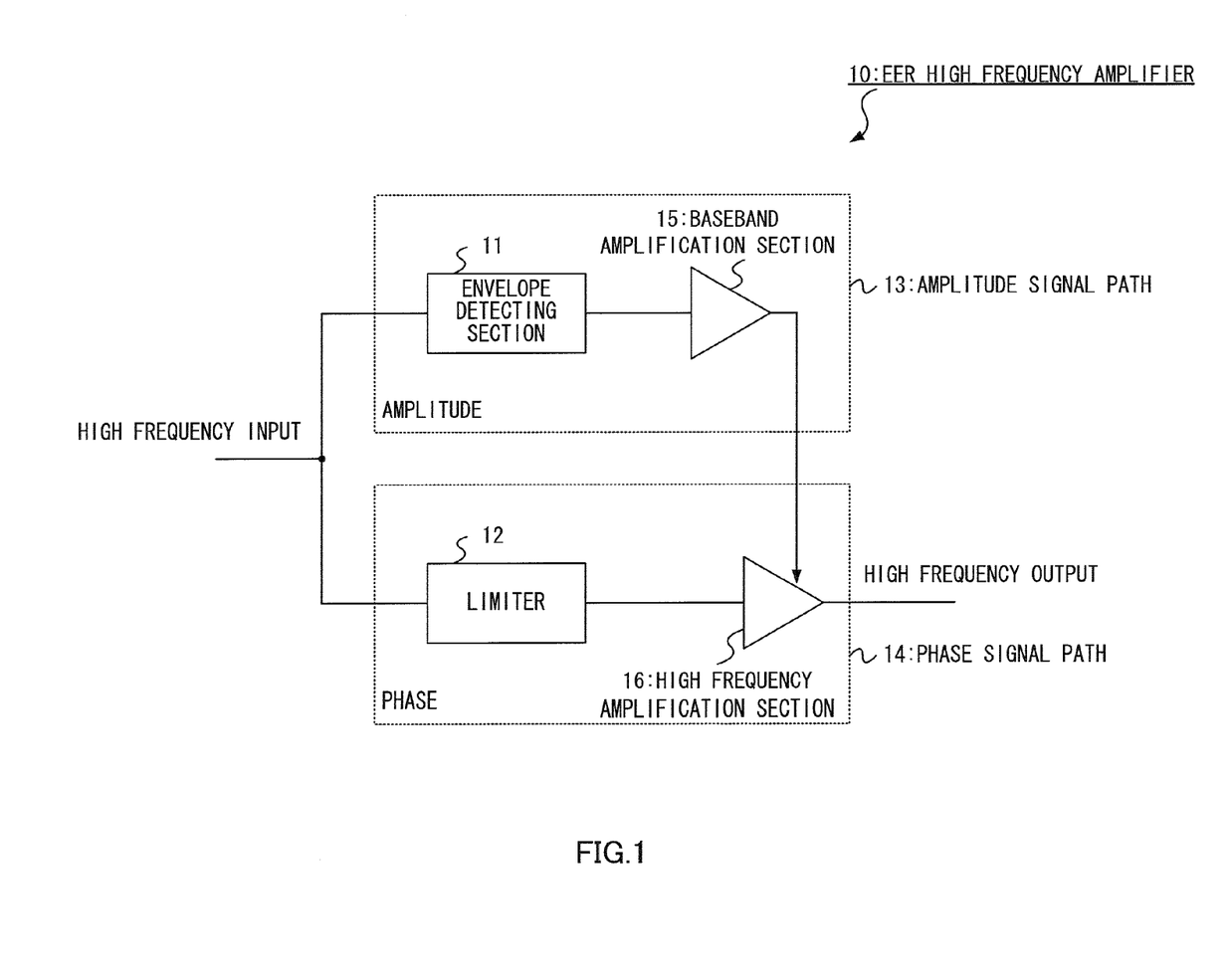
FIG. 1 is a schematic configuration diagram of a conventionally used EER high frequency amplifier.

FIG. 1 is a schematic configuration diagram of a conventionally used EER high frequency amplifier. In FIG. 1, when a high frequency signal is inputted to EER high frequency amplifier 10, the high frequency signal is broken down into polar components of the amplitude component and the phase component through envelope detection section 11 and limiter 12. Then, the broken down amplitude component and phase component flow through different paths (that is, amplitude signal path 13 and phase signal path 14), and are separately amplified. That is, when the phase signal flowing through phase signal path 14 is amplified at high frequency amplification section 16, and the amplitude signal flowing through amplitude signal path 13 is amplified at baseband amplification section 15, the amplitude signal amplified at baseband amplification section 15 becomes a power supply voltage of high frequency amplification section 16, and thereby high frequency amplification section 16 carries out amplitude modulation, recombines the amplitude component and the phase component, and outputs a linearly-amplified high frequency signal.

However, with an actual EER high frequency amplifier, unless a width of the dynamic range of gain fluctuation of high frequency amplification section 16 due to a change of the power supply voltage is ensured wide enough for the amplitude component, it is not possible to accurately indicate the amplitude signal which should be originally generated, and, as a result, a desired high frequency signal cannot be outputted. Therefore, high frequency amplification section 16 must realize a wide dynamic range. In particular, when the power supply voltage is made lower, and gain of high frequency amplification section 16 is made lower, leak of an input signal to the output side due to insufficiency of the isolation between the input and the output of high frequency amplification section 16 becomes prominent, and therefore the dynamic range of gain with respect to the power supply voltage may be restricted.

Figure 2:
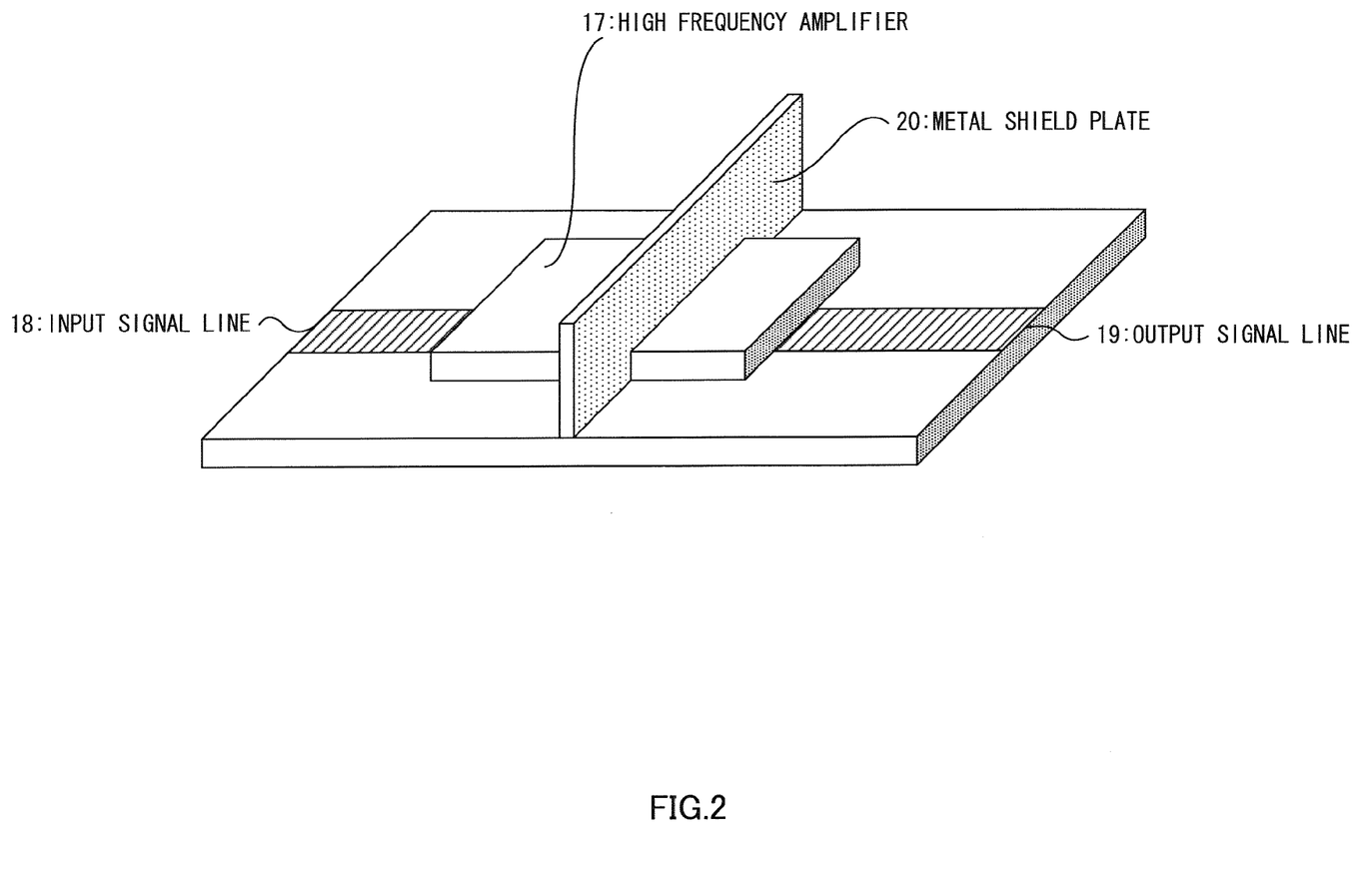
FIG. 2 is a conceptual diagram for improving the isolation between the input and the output of the conventional high frequency amplifier.

As a measure to improve insufficiency of the isolation, a method is known where a metal plate is inserted between the input and the output of the high frequency amplifier to prevent electrical coupling between the input and the output because of space. FIG. 2 is a conceptual diagram for improving the isolation between the input and the output in the conventional high frequency amplifier. As shown in FIG. 2, metal shield plate 20 is provided between the input and the output of high frequency amplifier 17, and input signal line 18 and output signal line 19 are isolated from the high frequency signal. That is, it is possible to improve the isolation by suppressing spatial electrical coupling between the input and the output of high frequency amplifier 17 using metal shield plate 20 (for example, see Non-Patent Document 1).

Further, a method is known for improving the isolation by providing an impedance matching circuit at the input or interstage of the high frequency amplifier, and providing a voltage variable element in this impedance matching circuit. According to this technique, it is possible to change a ratio between a reflected wave and a traveling wave (that is, SWR) by changing a constant of the voltage variable element of the impedance matching circuit using a control voltage, and reduce a leak signal to the output side by suppressing the quasi input signal by substantially increasing the SWR, so that it is possible to improve the isolation (for example, Patent Document 2).

Patent Document 1: Japanese Patent No. 3207153
Patent Document 2: Japanese Patent Application Laid-Open No. HEI8-222973
Non-Patent Document 1: "New Low Frequency/High Frequency Circuit Design Manual" Masaomi Suzuki, CQ Publishing, 1998

DISCLOSURE OF INVENTION

Problems to be Solved by the Invention

However, with the above-described technique of Non-Patent Document 1, a physical shield measure is taken which uses a metal shield plate provided between the input and the output of the high frequency amplifier, and therefore a shield effect can be obtained only in the case of spatial coupling between the input and the output of the high frequency amplifier. Therefore, it is not possible to substantially improve the isolation including the isolation of space and the isolation between lines, and therefore the increase of the dynamic range of gain of the high frequency amplifier is limited. Further, with the above-described technique of Patent Document 2, it is not possible to improve the isolation inside the device used for the high frequency amplifier, and therefore the dynamic range of gain cannot be substantially increased.

It is therefore an object of the present invention to provide an EER high frequency amplifier with the improved isolation inside the device by carrying out predetermined control on the device used for the high frequency amplification section, and the increased dynamic range of gain of the high frequency amplification section.

Means for Solving the Problems

An EER modulation amplifier of the present invention outputs a desired modulated and amplified signal from a high frequency amplification section by separating a phase signal and an amplitude signal from an inputted high frequency signal, amplifying the signals individually, and controlling a drain voltage of the high frequency amplification section based on the amplified amplitude signal, the EER modulation amplifier employs a configuration having: a drain voltage generating section that generates a drain voltage according to the amplitude signal and supplies the drain voltage to a drain terminal of the high frequency amplification section; a drain voltage determining section that determines a magnitude of the drain voltage generated by the drain voltage generating section in comparison to a predetermined reference voltage; and a gate voltage control section that controls a gate voltage of the high frequency amplification section according to the magnitude relationship between the reference voltage and drain voltage determined by the drain voltage determining section.

Furthermore, the EER modulation amplifier of the present invention employs a configuration wherein: the reference voltage is formed with a first reference voltage and a second reference voltage which has a higher voltage level than the first reference voltage; and the gate voltage control section holds an initially set gate voltage when the drain voltage is determined to be lower than the first reference voltage, and controls the gate voltage in proportion to the drain voltage when the drain voltage is determined to be higher than the first reference voltage and lower than the second reference voltage.

Furthermore, the EER modulation amplifier of the present invention employs a configuration wherein: the gate voltage control section holds an initially set gate voltage when the drain voltage is determined to be higher than the second reference voltage, and controls the gate voltage in proportion to the drain voltage when the drain voltage is determined to be lower than the second reference voltage and higher than the first reference voltage.

Still further, the EER modulation amplifier of the present invention employs a configuration wherein: the drain voltage determining section directly detects the amplitude signal separated from the high frequency signal and determines the magnitude of the amplitude signal in comparison to the reference voltage, instead of determining the magnitude of the drain voltage in comparison to the reference voltage.

Advantageous Effect of the Invention

According to the present invention, by comparing the drain voltage of the high frequency amplification section and a predetermined reference voltage, and, when the drain voltage is lower than (or higher than) the reference voltage, controlling the gate voltage of the device used for the high frequency amplification section, gain of the device is suppressed, and the isolation inside the device is improved. By this means, it is possible to increase the dynamic range of gain of the high frequency amplification section. That is, by controlling the gate voltage according to the drain voltage, the isolation between the input and the output of the high frequency amplification section is improved, so that it is possible to increase the dynamic range of gain of the high frequency amplification section without adding components.

Furthermore, according to the present invention, the isolation between the input and the output of the device (for example, GaAs FET) configuring the high frequency amplification section changes according to the gate voltage, and therefore, when the drain voltage of the high frequency amplification section is lower than the predetermined first reference voltage, the initially set gate voltage is held, and, when the drain voltage is higher than the first reference voltage, the gate voltage is controlled in proportion to the drain voltage. By controlling the gate voltage in this way, it is possible to improve the isolation and increase the dynamic range of gain of the high frequency amplification section.

Further, according to the present invention, when the drain voltage of the high frequency amplification section is higher than the second reference voltage which is set at a higher level than the first reference voltage, the initially set gate voltage is held, and, when the drain voltage is lower than the second reference voltage, the gate voltage is controlled in proportion to the drain voltage. By controlling the gate voltage in this way, even if the drain voltage is at high level, it is possible to improve the isolation and increase the dynamic range of gain of the high frequency amplification section.

BEST MODE FOR CARRYING OUT THE INVENTION

The present invention has a feature of improving the isolation inside the device used for the high frequency amplification section by controlling the gate voltage of the device as necessary without adding components or changing substrates, and increasing the dynamic range of overall gain of the EER high frequency amplifier. Therefore, it is possible to increase the dynamic range of gain with a simple circuit configuration which is not different from the conventional EER high frequency amplifier, so that it is possible to further improve cost-effectiveness of the EER high frequency amplifier. Hereinafter, an embodiment of the EER high frequency amplifier according to the present invention will be described. Components that are common in each drawing used in the embodiment will be assigned the same reference numerals, and duplicate description will be omitted.

Figure 3:
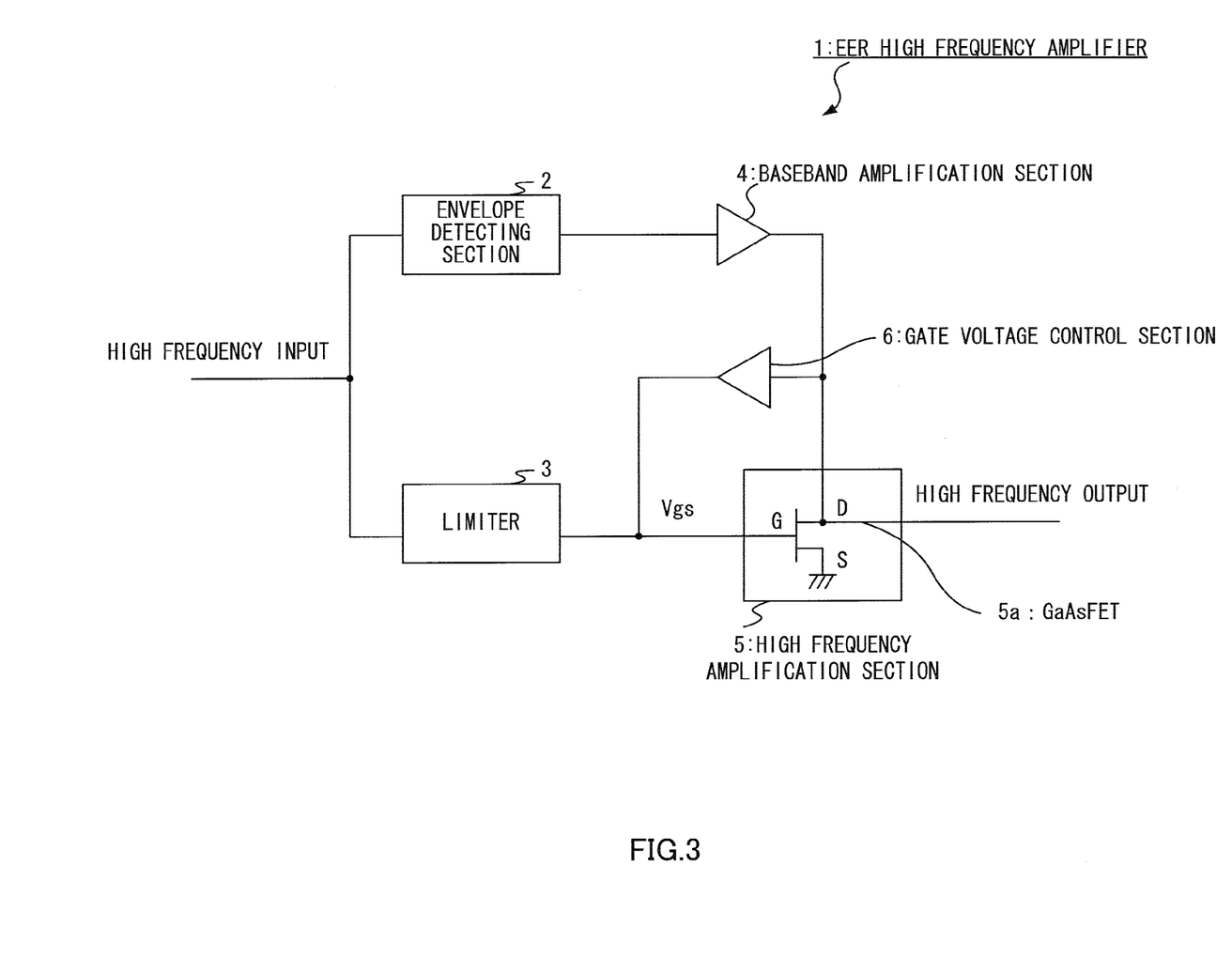
FIG. 3 is a configuration diagram of an EER high frequency amplifier according to an embodiment of the present invention.

FIG. 3 is a configuration diagram of the EER high frequency amplifier according to an embodiment of the present invention. In FIG. 3, EER high frequency amplifier 1 has: envelope detecting section 2 that detects the envelope of an inputted high frequency signal and extracts the amplitude component; limiter 3 that extracts the phase component from the inputted high frequency signal; baseband amplification section 4 that amplifies the amplitude signal separated into the amplitude component by envelope detecting section 2; high frequency amplification section 5 that is formed with depression-type GaAs FET 5a and amplifies the phase signal separated into the phase component and performs amplitude modulation using the amplitude signal amplified by baseband amplification section 4 as a power supply; and gate voltage control section 6 that controls the gate voltage of GaAs FET 5a in high frequency amplification section 5.

Next, the operation of EER high frequency amplifier 1 shown in FIG. 3 will be described. When a high frequency signal is inputted to EER high frequency amplifier 1, envelope detecting section 2 detects the envelope of the high frequency signal to extract the amplitude component, and limiter 3 extracts the phase component from the high frequency signal. Then, baseband amplification section 4 generates a voltage according to the amplitude signal included in the amplitude component inputted from envelope detecting section 2 and provides that voltage as the power supply voltage of the drain (D) of GaAs FET 5a in high frequency amplification section 5. This drain voltage is constantly monitored by gate voltage control section 6. When the drain voltage becomes lower (or higher) than a predetermined reference voltage, gate voltage control section 6 makes gate voltage Vgs variable and increases or decreases the isolation between the input and the output of GaAs FET 5a.

For example, when the drain voltage of GaAs FET 5a is lower than the first reference voltage, gate voltage control section 6 decreases gate voltage Vgs to increase the isolation between the input and the output of GaAs FET 5a, and, when the drain voltage higher than the first reference voltage and up to a predetermined voltage, makes the gate voltage proportional to the drain voltage, and carries out normal amplification control. Further, when the drain voltage of GaAs FET 5a is higher than the second reference voltage which is set at a higher voltage level than the first reference voltage, gate voltage control section 6 decreases gate voltage Vgs to increase the isolation between the input and the output of GaAs FET 5a, and, when the drain voltage is lower than the second reference voltage and higher than the first reference voltage, makes the gate voltage proportional to the drain voltage, and carries out normal amplification control. By carrying out gate voltage control in this way, the isolation between the input and the output of GaAs FET 5a is controlled, and the dynamic range of gain in high frequency amplification section 5 is improved.

Figure 4:
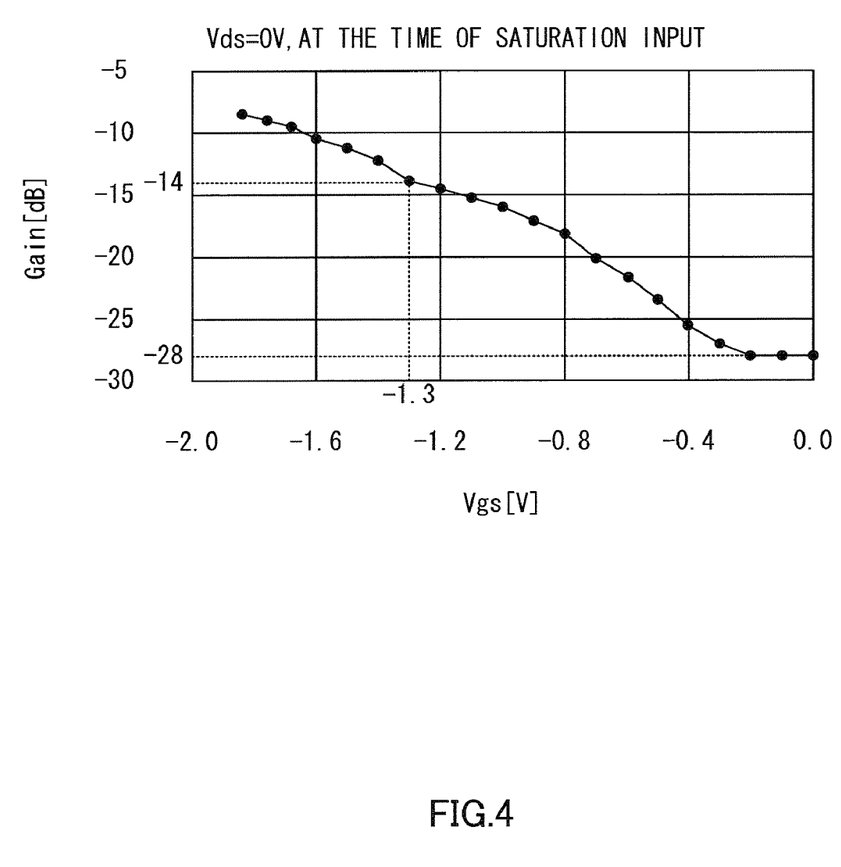
FIG. 4 is a characteristic diagram showing a relationship of gain to a gate voltage of GaAs FET realized by the EER high frequency amplifier of FIG. 3.

FIG. 4 is a characteristic diagram showing a relationship of the gain (Gain) to the gate voltage (Vgs) of GaAs FET realized by EER high frequency amplifier 1 of FIG. 3. That is, the characteristic diagram of FIG. 4 shows fluctuation of the gain (Gain) when the drain voltage (Vds) of GaAs FET 5a is fixed at 0 V and the gate voltage (Vgs) is made variable.

Generally, in EER high frequency amplifier 1, it is ideal that there is no coupling between the input and the output of GaAs FET 5a when the drain voltage (Vds) of GaAs FET 5a is 0 V, and therefore, when the drain voltage (Vds) is 0 V, the smaller gain (Gain) GaAs FET 5a has, the better. In other words, the bias voltage for operating GaAs FET 5a as a saturated amplifier (that is, gate voltage (Vgs)) is approximately Vgs=−1.3 V, and therefore, as shown in the characteristic diagram of FIG. 4, by making the gate voltage (Vgs) of GaAs FET 5a variable from −1.3 V to 0 V, the gain (Gain) is reduced from −14 dB to −28 dB by approximately 14 dB. By this means, the amount of reduction in gain (Gain) indicates the degree of improvement of the isolation when the drain voltage (Vds) is 0 V.

Figure 5:
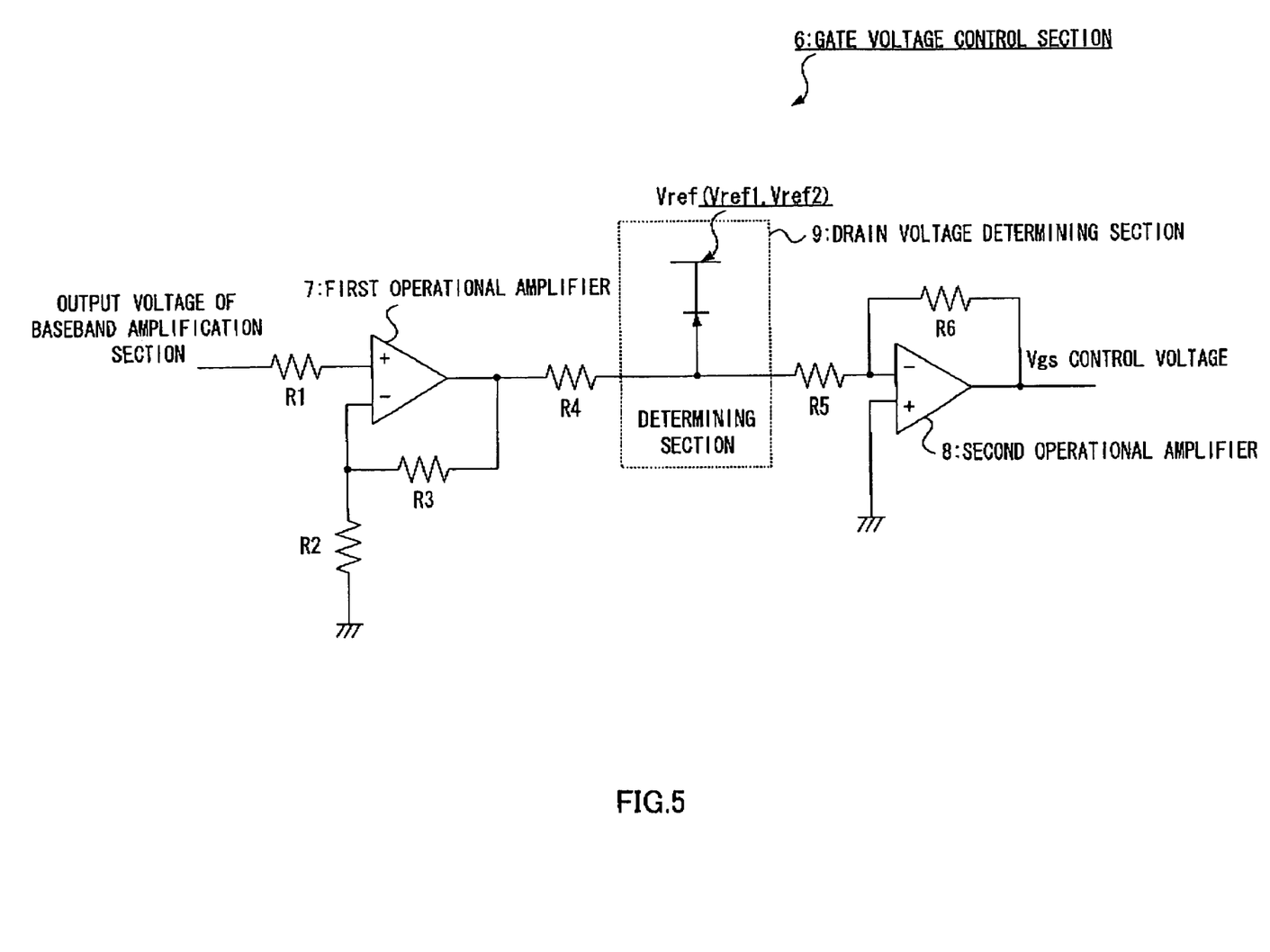
FIG. 5 shows an example of a circuit configuration inside the gate voltage control section of FIG. 3.

FIG. 5 shows an example of a circuit configuration inside gate voltage control section 6 of FIG. 3. As shown in FIG. 5, an internal circuitry of gate voltage control section 6 has first operational amplifier 7, second operational amplifier 8, drain voltage determining section 9 and a plurality of resistances around. Therefore, the operation of gate voltage control section 6 will be described with reference to FIG. 3 and FIG. 5. The output voltage of baseband amplification section 4 (that is, drain voltage) is amplified at first operational amplifier 7 and second operational amplifier 8 to provide the gate voltage (Vgs) of GaAs FET 5a in high frequency amplification section 5, and a drain voltage (Vds) is constantly monitored by drain voltage determining section 9.

When drain voltage determining section 9 detects that the drain voltage (Vds) of GaAs FET 5a is lower than (or higher than) the reference voltage (Vref), gate voltage control section 6 starts controlling the gate voltage (Vgs). That is, when the drain voltage is lower than the reference voltage (Vref), which is set at a first reference voltage, the initially set gate voltage (Vgs) is held, and, when the drain voltage is higher than the first reference voltage and lower than the predetermined voltage, the gate voltage (Vgs) is controlled in proportion to the drain voltage (Vds). When the drain voltage is higher than the reference voltage (Vref), which is set at a second reference voltage which is higher than the first reference voltage, the initially set gate voltage (Vgs) is held, and, when the drain voltage is lower than the second reference voltage and higher than the first reference voltage, the gate voltage (Vgs) is controlled in proportion to the drain voltage (Vds).

By controlling the gate voltage (Vgs) of GaAs FET 5a in this way, it is possible to increase the dynamic range of the gain (Gain) by increasing or decreasing the isolation between the input and the output of GaAs FET 5a without interfering amplification operation in the range of normal use. In FIG. 5, although a case has been shown where diode D is used as drain voltage determining section 9, other devices having the same function can be obviously used. Further, a drain voltage determining section may adopt other circuit configurations having the same function. It is also possible to directly use an output signal (that is, amplitude signal) of the envelope detecting section as a signal inputted to drain voltage determining section 9. Further, although a GaAs FET has been described as an example of the device used for the high frequency amplification section, other devices having the same function can be obviously used.

The operation of gate voltage control section 6 is not limited to the above-described gate voltage control, and, for example, gate voltage control section 6 may control the gate voltage in inversely proportion to the drain voltage and control the isolation between the input and the output of GaAs FET 5a, thereby making it possible to improve the dynamic range of gain in high frequency amplification section 5. When gate voltage control section 6 controls the gate voltage so as to be proportional to the logarithm of the drain voltage, or controls the gate voltage so as to be inversely proportional to the logarithm of the drain voltage, it is also possible to control the isolation between the input and the output of GaAs FET 5a, so that the dynamic range of gain in high frequency amplification section 5 can be improved.

Figure 6:
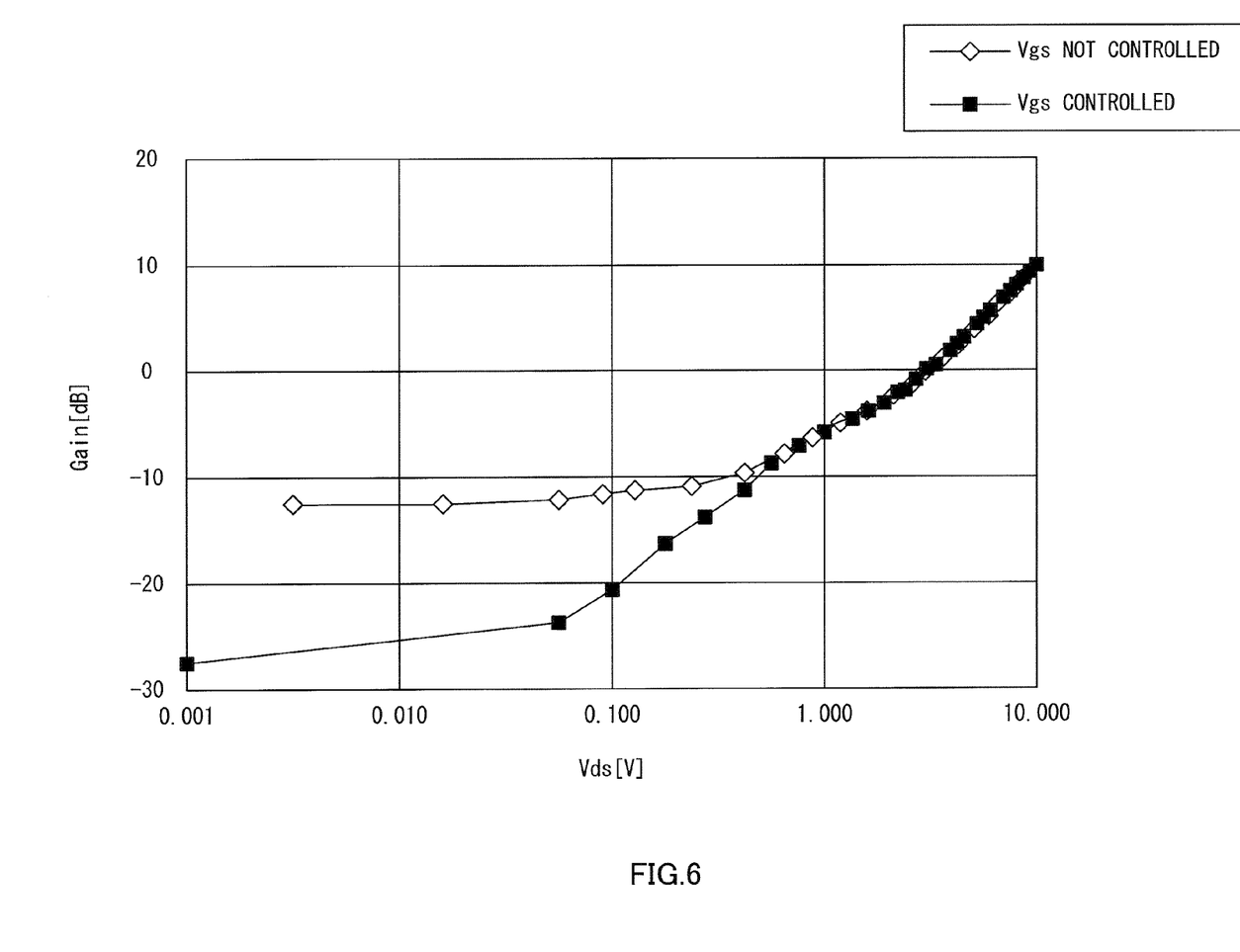
FIG. 6 is a characteristic diagram as a result of experiment of improving the dynamic range when the circuit of the gate voltage control section shown in FIG. 5 is used.

FIG. 6 is a characteristic diagram as a result of experiment of improving the dynamic range when the circuit of the gate voltage control section as shown in FIG. 5 is used in EER high frequency amplifier 1, where the horizontal axis indicates the drain voltage (Vds) and the vertical axis indicates the gain (Gain). As shown in FIG. 6, when the gate voltage (Vgs) is not controlled (Vgs not controlled), even if the drain voltage (Vds) decreases to lower than 0.1V, the gain (Gain) decreases only to approximately −13 dB. However, when the gate voltage (Vgs) is controlled (Vgs controlled), and the drain voltage (Vds) is 0.001V, the gain (Gain) decreases to approximately −29 dB, and, when the drain voltage (Vds) decreases to lower than 0.1V, the gain (Gain) decreases to approximately −20 dB. That is, by controlling the gate voltage, the isolation improves by approximately 16 dB, and, as a result, the dynamic range of gain (Gain) of the high frequency amplifier improves by approximately 16 dB.

The present application is based on Japanese Patent Application No. 2004-273890, filed on Sep. 21, 2004, the entire content of which is expressly incorporated by reference herein.

INDUSTRIAL APPLICABILITY

As described above, by using the EER high frequency amplifier of the present invention, it is possible to further improve the isolation inside the device used for the high frequency amplification section. Therefore, the EER high frequency amplifier of the present invention can be applied not only to base station apparatus and terminal equipment in mobile communication, but also to digital terrestrial television transmitters and high-speed wireless data communication apparatus.

The invention claimed is:

1. An EER modulation amplifier that outputs a desired modulated and amplified signal from a high frequency amplification section by separating a phase signal and an amplitude signal from an inputted high frequency signal, amplifying the signals individually, setting the amplified phase signal as a gate voltage of the high frequency amplification section, and controlling a drain voltage of the high frequency amplification section based on the amplified amplitude signal, the EER modulation amplifier comprising:
   a drain voltage generating section that generates a drain voltage according to the amplitude signal and supplies the drain voltage to a drain terminal of the high frequency amplification section;
   a drain voltage determining section that determines a magnitude of the drain voltage in comparison to a first reference voltage set in advance; and
   a gate voltage control section that holds an initially set first gate voltage when the drain voltage is lower than the first reference voltage, and makes the gate voltage of the high frequency amplification section variable according to the drain voltage when the drain voltage is higher than the first reference voltage.

2. The EER modulation amplifier according to claim 1, wherein the gate voltage control section makes the gate voltage of the high frequency amplification section proportional to the drain voltage when the drain voltage is higher than the first reference voltage.

3. The EER modulation amplifier according to claim 1, wherein the gate voltage control section makes the gate voltage of the high frequency amplification section inversely proportional to the drain voltage when the drain voltage is higher than the first reference voltage.

4. The EER modulation amplifier according to claim 1, wherein the gate voltage control section makes the gate voltage of the high frequency amplification section proportional to a logarithm of the drain voltage when the drain voltage is higher than the first reference voltage.

5. The EER modulation amplifier according to claim 1, wherein the gate voltage control section makes the gate voltage of the high frequency amplification section inversely proportional to a logarithm of the drain voltage when the drain voltage is higher than the first reference voltage.

* * * * *